(12) United States Patent
Yang

(10) Patent No.: US 12,082,397 B2
(45) Date of Patent: Sep. 3, 2024

(54) SEMICONDUCTOR STRUCTURE MANUFACTURING METHOD AND SEMICONDUCTOR STRUCTURE

(71) Applicant: CHANGXIN MEMORY TECHNOLOGIES, INC., Hefei (CN)

(72) Inventor: Lei Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 456 days.

(21) Appl. No.: 17/598,840

(22) PCT Filed: Jun. 29, 2021

(86) PCT No.: PCT/CN2021/103221
§ 371 (c)(1),
(2) Date: Sep. 27, 2021

(87) PCT Pub. No.: WO2022/083168
PCT Pub. Date: Apr. 28, 2022

(65) Prior Publication Data
US 2023/0055073 A1    Feb. 23, 2023

(30) Foreign Application Priority Data

Oct. 23, 2020 (CN) .......................... 202011144602.6

(51) Int. Cl.
*H10B 12/00*        (2023.01)
(52) U.S. Cl.
CPC ............. *H10B 12/30* (2023.02); *H10B 12/03* (2023.02); *H10B 12/482* (2023.02)
(58) Field of Classification Search
CPC .. H10B 12/0335; H10B 12/315; H10B 12/00; H10B 12/02; H10B 12/03; H10B 12/30; H10B 12/482; H10B 12/485
See application file for complete search history.

(56) References Cited

U.S. PATENT DOCUMENTS 6,927,119 B2    8/2005  Lee et al.
10,181,401 B1*  1/2019  Shih ................... H01L 21/0273
(Continued)

FOREIGN PATENT DOCUMENTS

CN         1525571 A    9/2004
CN       107706179 A    2/2018
(Continued)

OTHER PUBLICATIONS

International Search Report cited in PCT/CN2021/103221 mailed Sep. 28, 2021, 9 pages.

*Primary Examiner* — Michelle Mandala
*Assistant Examiner* — Kevin Quinto
(74) *Attorney, Agent, or Firm* — Kilpatrick Townsend & Stockton LLP

(57) ABSTRACT

The embodiments of the present application belong to the technical field of semiconductor manufacturing, and relate to a semiconductor structure manufacturing method and a semiconductor structure. The semiconductor structure manufacturing method includes: the substrate is provided with a plurality of active area structures and a plurality of first hole structures arranged at intervals, first bonding pad structures are formed in the first hole structures, and the first bonding pad structures are electrically connected to the active area structures; and second bonding pad structures are formed on the first bonding pad structures, and the second bonding pad structures are connected to the first bonding pad structures, and connected to a capacitor structure.

9 Claims, 13 Drawing Sheets

(56) References Cited

U.S. PATENT DOCUMENTS

| | | | |
|---|---|---|---|
| 10,468,350 B2 | 11/2019 | Kim et al. | |
| 2003/0213982 A1 | 11/2003 | Kim | |
| 2018/0247943 A1 | 8/2018 | Feng et al. | |
| 2020/0203354 A1* | 6/2020 | Lee | H01L 21/7682 |

FOREIGN PATENT DOCUMENTS

| | | |
|---|---|---|
| CN | 108987346 A | 12/2018 |
| CN | 111354711 A | 6/2020 |

\* cited by examiner

SEMICONDUCTOR STRUCTURE MANUFACTURING METHOD AND SEMICONDUCTOR STRUCTURE

CROSS-REFERENCE TO RELATED APPLICATIONS

The present application claims priority to Chinese Patent Application No. 202011144602.6, filed on Oct. 23, 2020, entitled "Semiconductor Structure Manufacturing method and Semiconductor Structure". The entire contents of International Application No. PCT/CN2021/103221 and Chinese Patent Application No. 202011144602.6 are incorporated herein by reference.

TECHNICAL FIELD

The embodiments of the present application relate to the technical field of semiconductors, and in particular to a semiconductor structure manufacturing method and a semiconductor structure.

BACKGROUND

As memory device technology has progressively developed, Dynamic Random Access Memory (DRAM) is increasingly applied in various electronic devices at its higher density and faster read-write speed. The dynamic random access memory is composed of a plurality of repeated memory units. Each storage unit generally comprises a capacitor structure and a transistor structure. A gate of the transistor structure is connected to a word line, a drain is connected to a bit line, and a source is connected to the capacitor structure. A voltage signal on the word line can control the transistor to be turned on or turned off, so that data information stored in the capacitor structure is read through the bit line, or the data information is written into the capacitor structure through the bit line for storage.

In the related art, the transistor structures are disposed in a substrate, a plurality of bonding pad structures are disposed on the substrate, and each bonding pad structure is connected with the source of one transistor structure. During manufacturing, a conductive layer is firstly formed on the substrate, then the conductive layer is etched, and part of the conductive layer is removed to form a plurality of bonding pad structures arranged in an array manner; and an insulating support layer is formed between the bonding pad structures to fill gaps between the adjacent bonding pad structures.

Due to the fact that the size of each bonding pad structure is small, during etching, insufficient etching is likely to occur due to the limitation of the etching technology, and the adjacent bonding pad structures are bridged so as to generate defects.

SUMMARY

The embodiment of the present application provides a semiconductor structure manufacturing method which includes: providing a substrate, the substrate includes a plurality of active area structures and a plurality of first hole structures distributed at intervals; forming first bonding pad structures in the first hole structures, surfaces, away from the substrate, of the first bonding pad structures are flush with the substrate, and the first bonding pad structures are electrically connected to the active area structures; and forming second bonding pad structures on the first bonding pad structures, the second bonding pad structures are connected to the first bonding pad structures, and the second bonding pad structures are connected to a capacitor structure.

The embodiment of the present application further provides a semiconductor structure manufactured by any of the above semiconductor structure manufacturing methods.

BRIEF DESCRIPTION OF THE DRAWINGS

In order to more clearly describe the technical solutions in the embodiments of the present application or the prior art, the following will briefly introduce the drawings that need to be used in the description of the embodiments or the prior art. It is apparent that the described embodiments are some embodiments and not all embodiments of the present application. Based on these drawings, all other drawings can be acquired by those of ordinary skill in the art without creative efforts.

DETAILED DESCRIPTION

To more clarify the objectives, technical solutions, and advantages of the embodiments of the present application, the technical solutions of the embodiments of the present application will be described clearly and completely with reference to accompanying drawings in the embodiments of the present application. It is apparent that the described embodiments are some embodiments and not all embodiments of the present application. Based on the embodiments of the present application, all other embodiments acquired by those of ordinary skill in the art without creative efforts are within in the protection scope of the present application.

Dynamic random access memory (DRAM) includes a capacitor structure and a transistor structure. A gate of the transistor structure is connected to a word line, a drain is connected to a bit line, and a source is connected to the capacitor structure. Data in the capacitor structure is read or data is written into the capacitor structure by controlling the opening or closing of transistors.

Transistor structures are often disposed within a substrate having bonding pad structures disposed thereon. Each bonding pad structure is electrically connected to a source of the transistor structure. During manufacturing, firstly a conductive layer (such as tungsten and the like) is formed on the substrate, and then the conductive layer is etched to remove part of the conductive layer so as to form a plurality of bonding pad structures distributed in an array manner on the substrate; and an insulating support layer is then formed between the bonding pad structures to fill gaps between the adjacent pad structures.

However, with the gradual miniaturization of the dynamic random access memory, the size of the bonding pad structures is small. During etching, insufficient etching is likely to occur due to the limitation of an etching process, so that the adjacent bonding pad structures cannot be completely separated, that is to say, the adjacent bonding pad structures are bridged so as to generate defects, and the yield of a semiconductor device is reduced.

The embodiment of the present application provides a semiconductor structure manufacturing method and a semiconductor structure. A plurality of first hole structures arranged at intervals are formed on a substrate firstly, then first bonding pad structures are formed in the first hole structures, then second bonding pad structures are formed on the first bonding pad structures, and the first bonding pad structures and the second bonding pad structures form an integrated structure. Compared with the method that a whole conductive layer is formed firstly and then the conductive layer is etched to form bonding pad structures, the method can avoid the problem that adjacent bonding pad structures are bridged due to the limitation of the etching technology in the forming process of the bonding pad structures so as to form defects, and ensures the yield of the semiconductor device.

Figure 1:
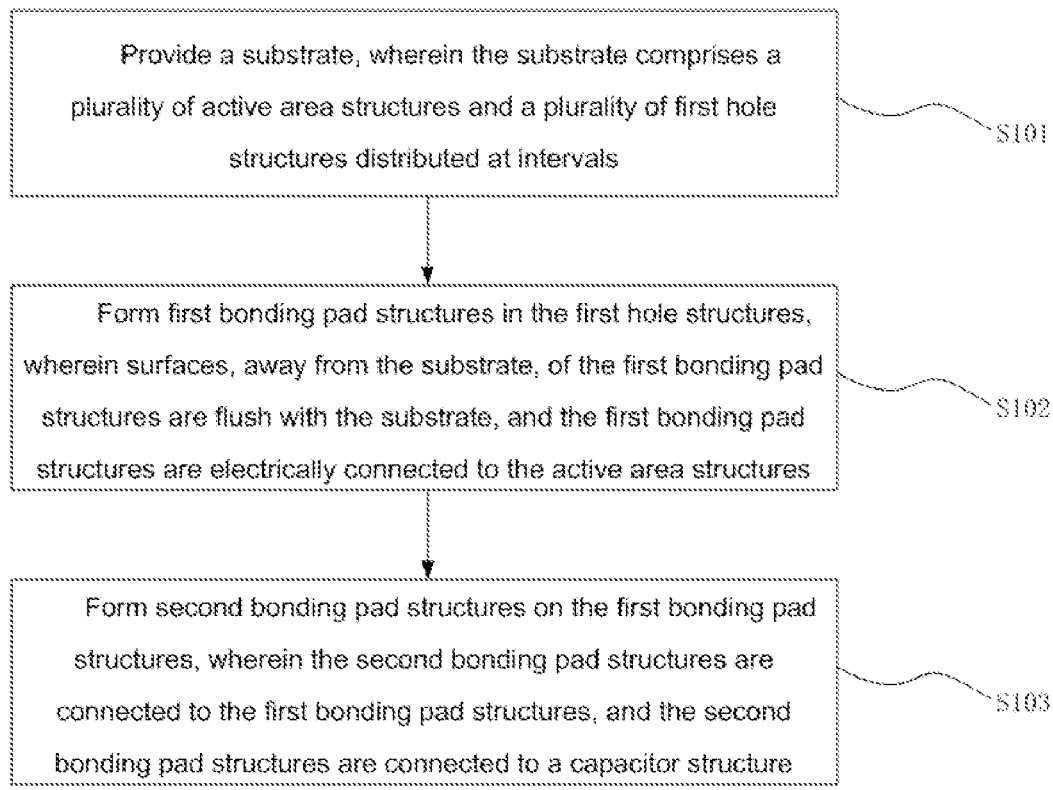
FIG. 1 is a flowchart of a semiconductor structure manufacturing method provided by an embodiment of the present application.

Referring to FIG. 1, FIG. 1 is a flowchart of a semiconductor structure manufacturing method provided by an embodiment of the present application. FIGS. 2-18 are schematic structural diagrams of all stages of semiconductor structure manufacturing. The semiconductor structure manufacturing method is described below with reference to FIGS. 1-18.

This embodiment does not limit a semiconductor structure, and will be described below with reference to the semiconductor structure being dynamic random access memory (DRAM) as an example. But this embodiment is not limited thereto, and the semiconductor structure in this embodiment may be other structures.

As shown in FIG. 1, the semiconductor structure manufacturing method provided by this embodiment includes:

S101: a substrate is provided, and the substrate includes a plurality of active area structures and a plurality of first hole structures distributed at intervals.

Figure 2:
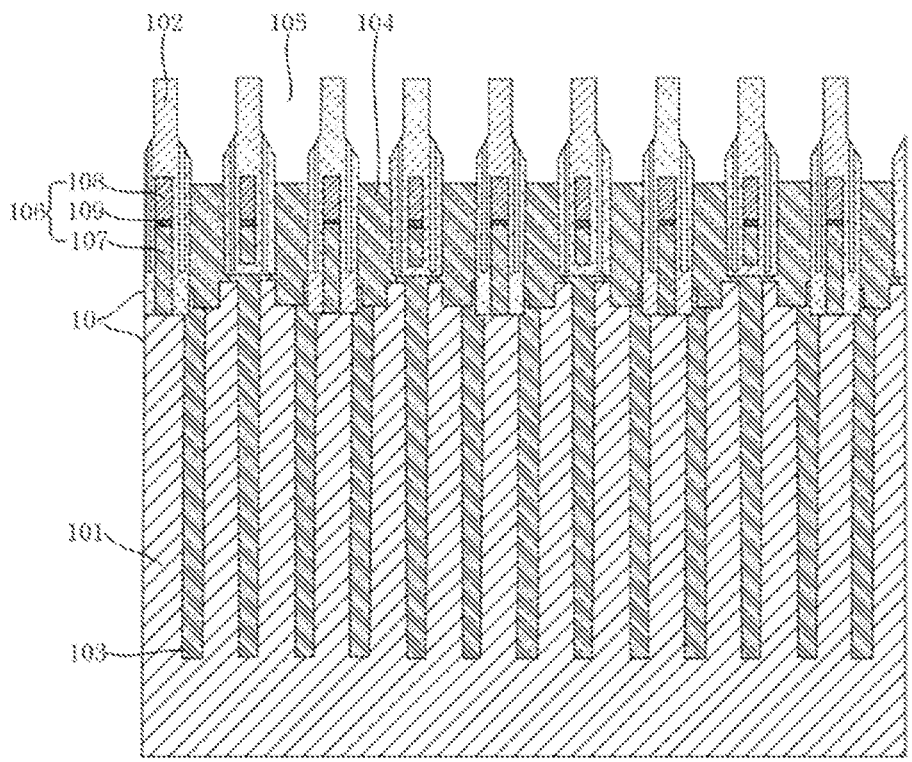
FIG. 2 is a schematic diagram of a structure after forming first hole structures in the semiconductor structure manufacturing method provided by an embodiment of the present application.
Figure 3:
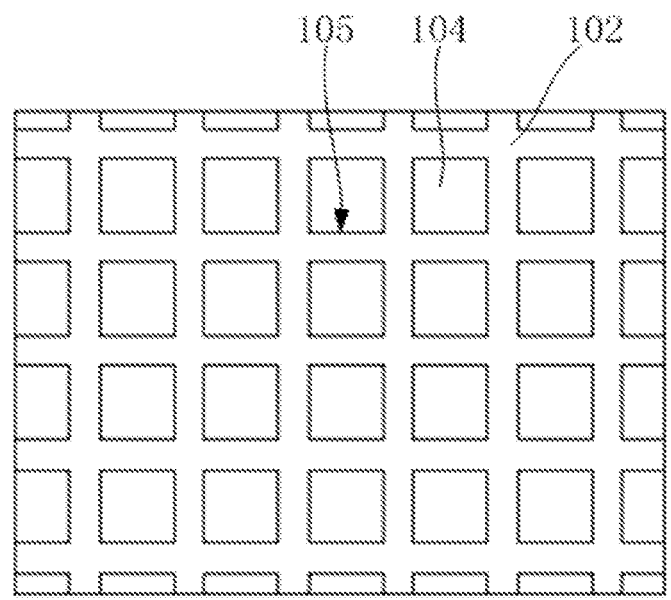
FIG. 3 is a top view of FIG. 2.

Exemplarily, as shown in FIG. 2 and FIG. 3, the substrate 10 may include a plurality of shallow groove isolation structures 103 distributed at intervals and the plurality of active area structures 101. In addition, the first hole structures 105 distributed at intervals are formed on the substrate 10.

Further, the shallow groove isolation structures 103 may be made of a material such as silica and the like.

Continuing to refer to FIG. 1, the semiconductor structure manufacturing method provided by this embodiment further includes:

S102: first bonding pad structures are formed in the first hole structures, surfaces, away from the substrate, of the first bonding pad structures are flush with the substrate, and the first bonding pad structures are electrically connected to the active area structures.

Figure 11:
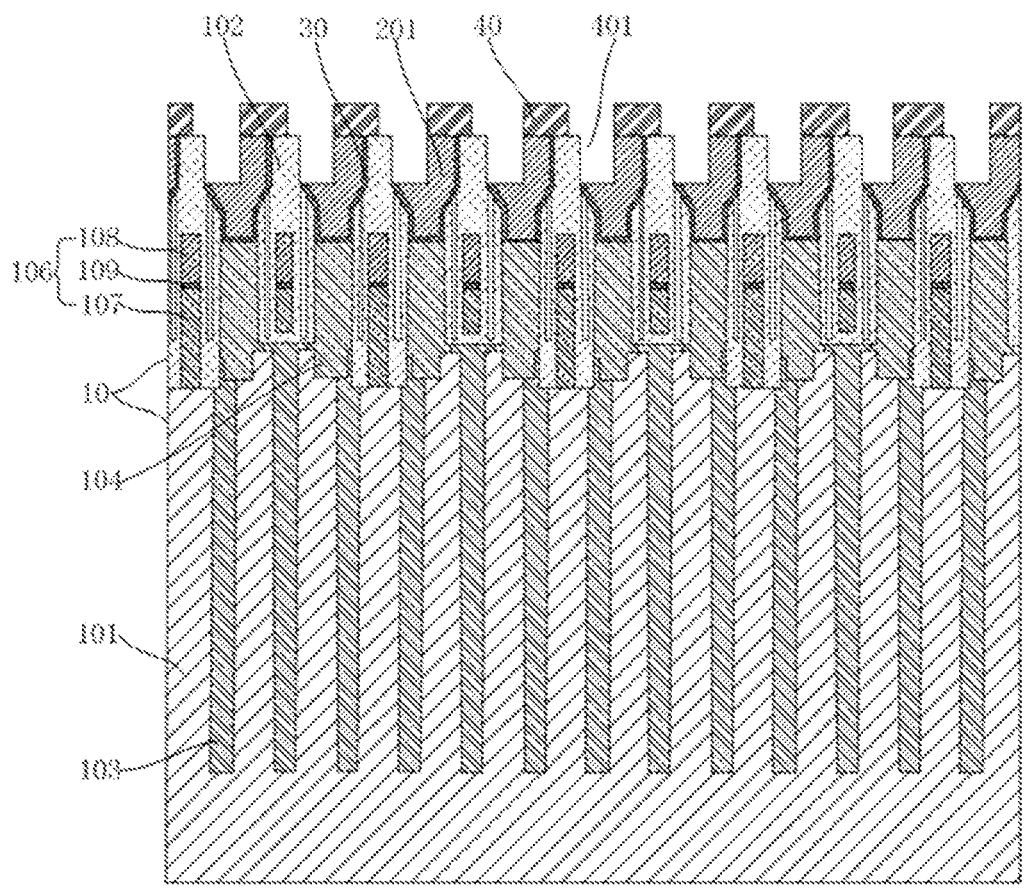
FIG. 11 is a schematic diagram of a structure after the first support layer is etched using the mask layer as a mask in the semiconductor structure manufacturing method provided by an embodiment of the present application.
Figure 12:
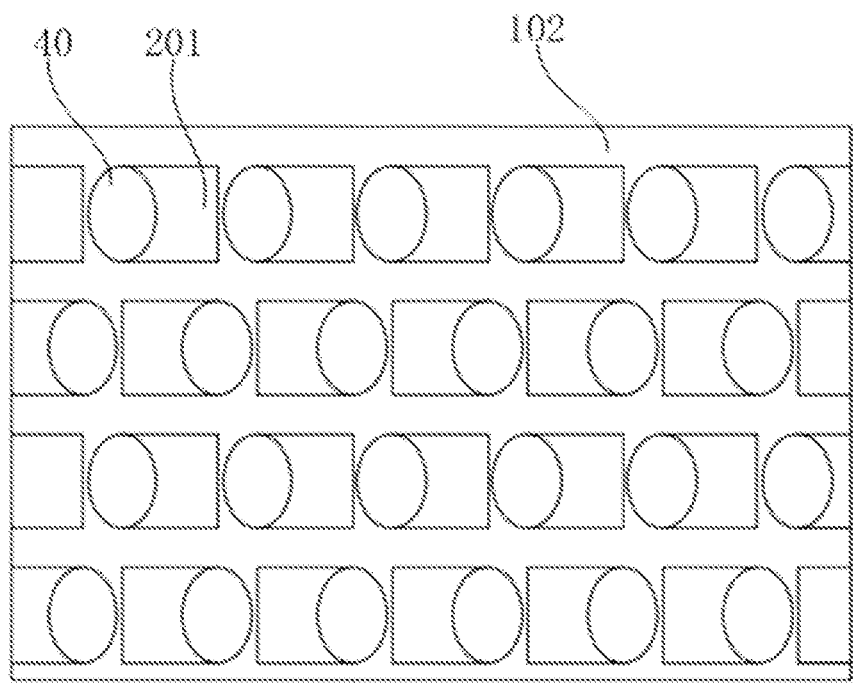
FIG. 12 is a top view of FIG. 11.
Figure 13:
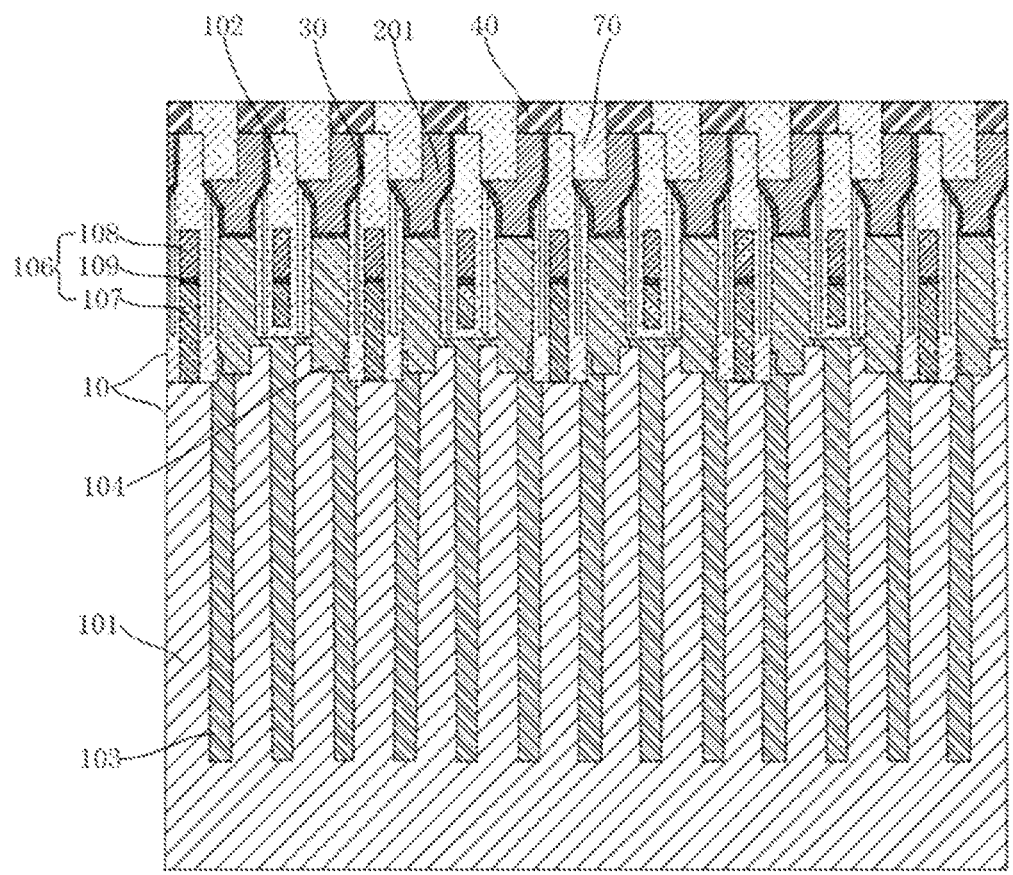
FIG. 13 is a schematic diagram of a structure after forming a second support layer in the semiconductor structure manufacturing method provided by an embodiment of the present application.
Figure 14:
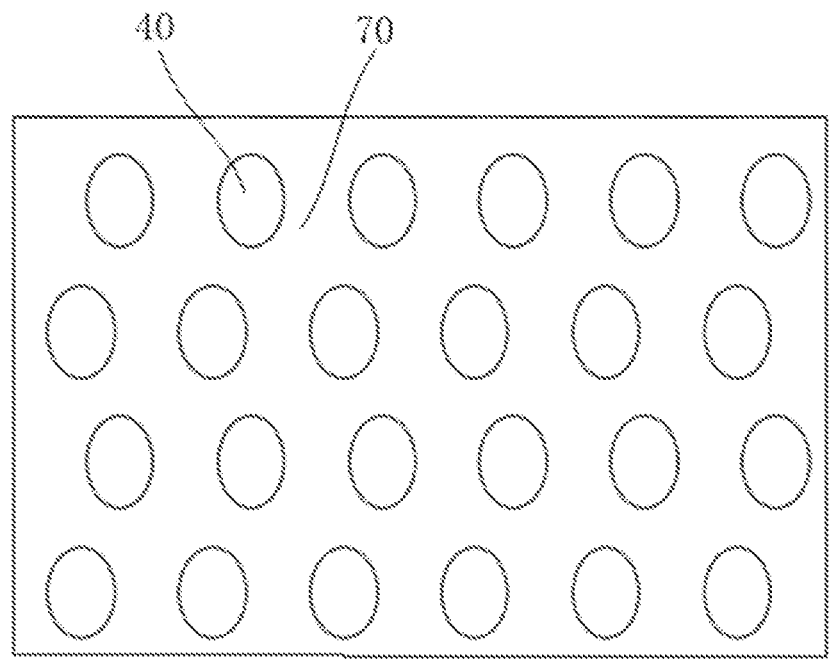
FIG. 14 is a top view of FIG. 13.
Figure 15:
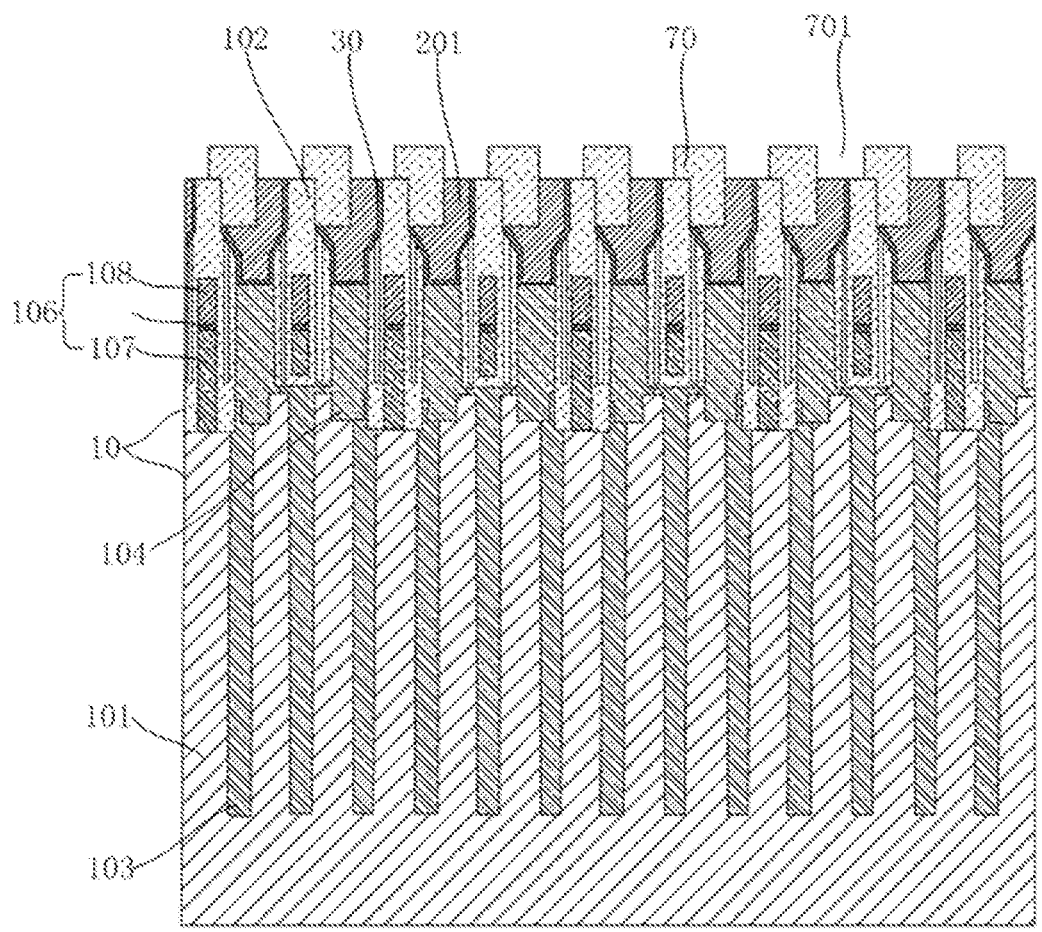
FIG. 15 is a schematic diagram of a structure after forming third hole structures in the semiconductor structure manufacturing method provided by an embodiment of the present application.
Figure 16:
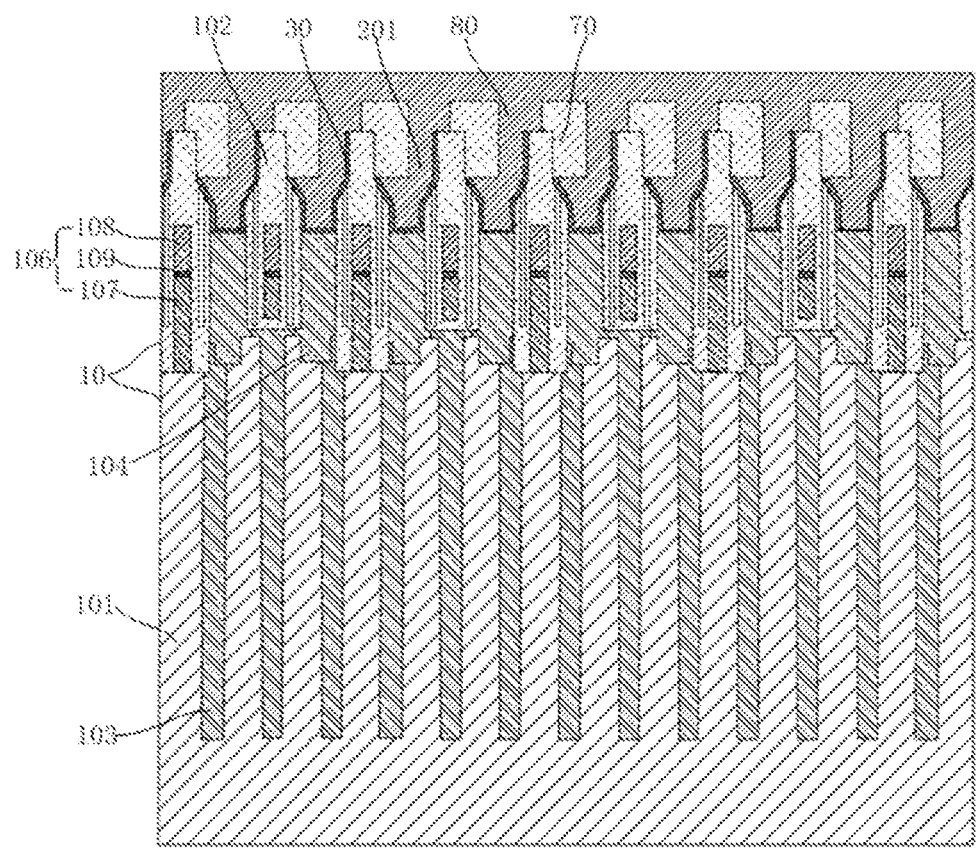
FIG. 16 is a schematic diagram of a structure after forming a second conductive layer in the semiconductor structure manufacturing method provided by an embodiment of the present application.

Exemplarily, as shown in FIG. 11 and FIG. 12, a first bonding pad structures 201 is formed in each first hole structures 105. Specifically, one first bonding pad structure 201 is formed in each first hole structure 105. The surfaces, away from the substrate 10, of the first bonding pad structures 201 are flush with a surface of the substrate 10. The first bonding pad structures 201 are electrically connected to the active area structures 101 in the substrate 10.

After the first bonding pad structures 201 are formed, the semiconductor structure manufacturing method provided by this embodiment further includes:

S103: second bonding pad structures are formed on the first bonding pad structures, the second bonding pad structures are connected to the first bonding pad structures, and the second bonding pad structures are connected to the capacitor structure.

Figure 17:
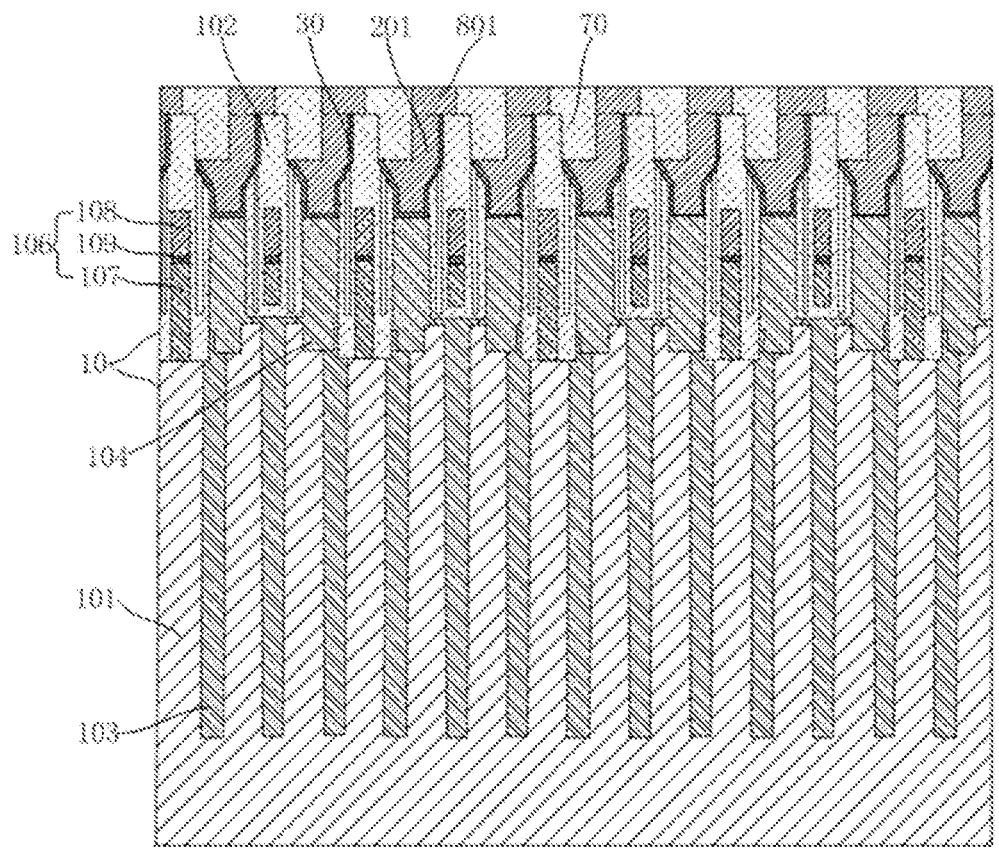
FIG. 17 is a schematic diagram of a structure after forming second pad structures in the semiconductor structure manufacturing method provided by an embodiment of the present application.
Figure 18:
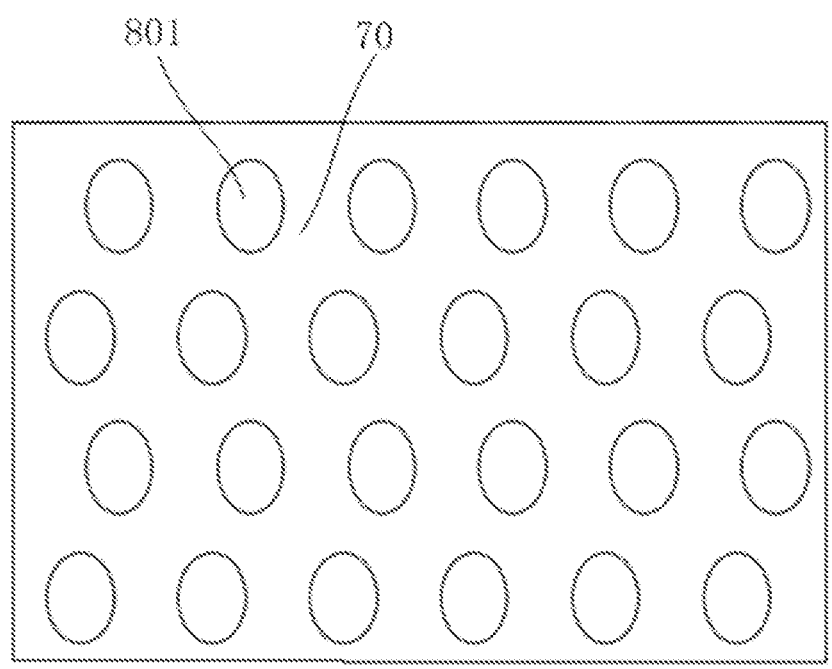
FIG. 18 is a top view of FIG. 17.

Exemplarily, as shown in FIG. 17 and FIG. 18, the second bonding pad structures 801 are formed on the first bonding pad structures 201, the second bonding pad structures 801 are connected to the first bonding pad structures 201, and the first bonding pad structures 201 and the second bonding pad structures 801 form an integrated structure.

In this embodiment, after the second bonding pad structures 801 are formed, the capacitor structure will be formed subsequently. The second bonding pad structures 801 are connected to the capacitor structure so that the capacitor structure can be connected to the active area structures 101 through the second bonding pad structures 801 and the first bonding pad structures 201, so as to realize electric connection between the capacitor structure and a source in the transistor structure in the dynamic random access memory.

Continuing to refer to FIG. 2, in this embodiment, the substrate 10 further includes bit line structures 106 and capacitor contact structures 104. An insulating layer 102 is formed on the bit line structures 106. The first bonding pad structures 201 are connected to the capacitor contact structures 104. The capacitor contact structures 104 are connected to the active area structures 101.

Exemplarily, each bit line structure 106 may include a first bit line structure 107 and a second bit line structure 108 which are stacked. A material of the first bit line structure 107 may include polycrystalline silicon and the like. A material of the second bit line structure 108 may include tungsten and the like. A material of the insulating layer 102 may include silicon nitride and the like.

Further, each bit line structure 106 further include a bit line barrier layer 109 located between the first bit line structure 107 and the second bit line structure 108. The bit line barrier layer 109 may prevent influences to electrical performance of the semiconductor device caused by mutual penetration between the first bit line structure 107 and the second bit line structure 108 while achieving electrical connection between the first bit line structure 107 and the second bit line structure 108. Exemplarily, a material of the bit line barrier layer 109 may include titanium nitride and the like.

In the above implementation, as shown in FIG. 11, the first bonding pad structures 201 are connected to the active area structures 101 through the capacitor contact structures 104. The capacitor contact structures 104 and the bit line structures 106 are arranged in the substrate 10 at intervals. The capacitor contact structure 104 is disposed at side, facing towards the active area structure 101, of each first hole structure 105, and each capacitor contact structure 104 corresponds to one first hole structure 105, so that after the first bonding pad structure 201 is formed in the first hole structure 105, the first bonding pad structure 201 can be electrically connected to the corresponding active area structure 101 through the capacitor contact structure 104. Exemplarily, a material of the capacitor contact structures 104 may include conductive a material such as polycrystalline silicon and the like. This embodiment does not limit the material of the capacitor contact structures 104.

According to the semiconductor structure manufacturing method provided by this embodiment, the substrate 10 is provided with the plurality of active area structures 101 and the plurality of first hole structures 105 arranged at intervals. The first bonding pad structures 201 are formed in the first hole structures 105, and the first bonding pad structures 201 are electrically connected to the active area structures 101. The second bonding pad structures 801 are formed on the first bonding pad structures 201. The second bonding pad structures 801 are connected to the first bonding pad structures 201, and connected to a capacitor structure. Compared with the method that a whole conductive layer is formed firstly and then the conductive layer is etched to form bonding pad structures, the method can avoid the problem that adjacent bonding pad structures are bridged due to the limitation of the etching technology in the forming process of the bonding pad structures so as to form defects, and ensures the yield of a semiconductor device.

According to the semiconductor structure manufacturing method provided by this embodiment, the step in which the first bonding pad structures 201 are formed in the first hole structures 105 includes:

As shown in FIGS. 4-12, a barrier layer 30 is formed on side walls and bottom walls of the first hole structures 105 and a surface of the substrate 10. First conductive layer 20 is formed on the barrier layer 30. The first hole structures 105 are filled with the barrier layers 30 and the first conductive layers 20. Part of the barrier layer 30 and part of the first conductive layer 20 are removed to form the first bonding pad structures 201 located in the first holes.

In this way, the barrier layers 30 can prevent the first conductive layers 20 from penetrating into the substrate 10, thereby ensuring the performance of the semiconductor device. In an implementation in which the first bonding pad structures 201 are connected to the active area structures 101 through the capacitor contact structures 104, when the barrier layers 30 are formed, the barrier layer 30 covers the side walls of the first hole structures 105, the surfaces of the capacitor contact structures 104 in the first hole structures 105 and the surface of the substrate 10. The barrier layer 30 can prevent penetration between the first conductive layer 20 and the capacitor contact structures 104, which improves the performance of the semiconductor structure.

Exemplarily, a material of the barrier layer 30 may include conductive a material such as titanium nitride and the like so as to achieve electrical connection between the first conductive layer 20 and the capacitor contact structures 104 while penetration between the first conductive layer 20 and the capacitor contact structures 104 is prevented. A material of the first conductive layer 20 may include conductive a material such as tungsten and the like.

Figure 4:
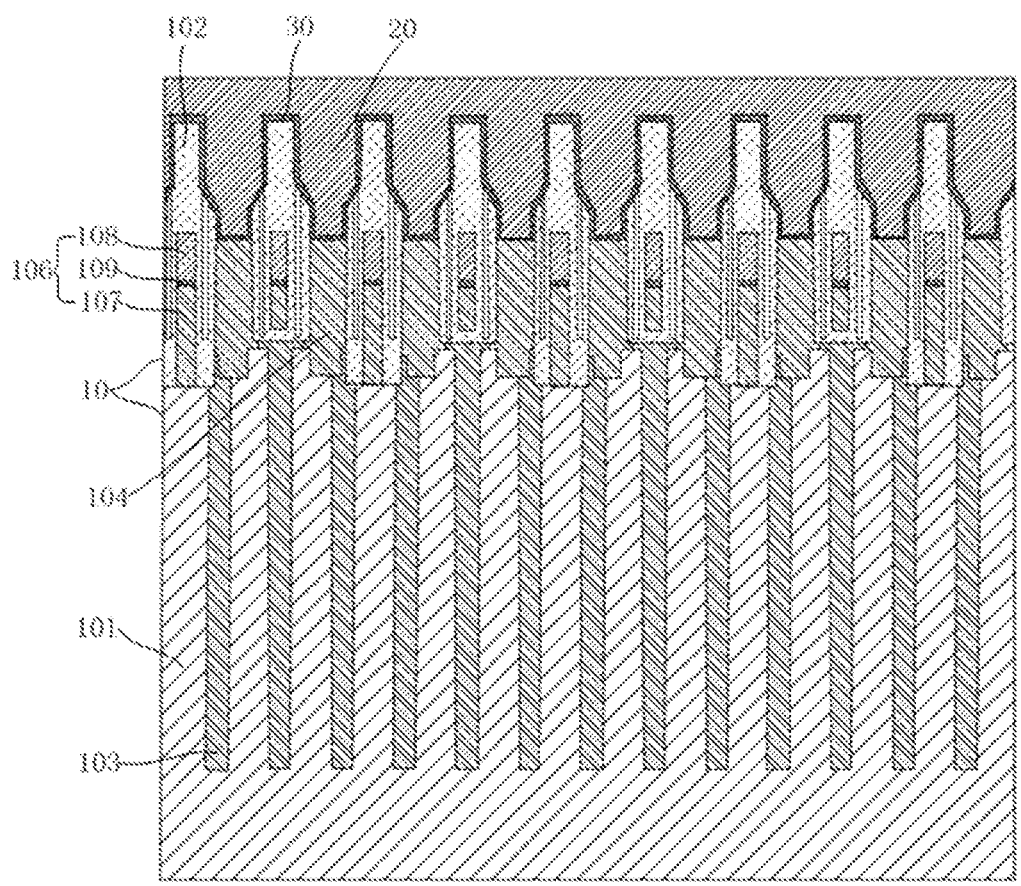
FIG. 4 is a schematic diagram of a structure after forming a first conductive layer in the semiconductor structure manufacturing method provided by an embodiment of the present application.
Figure 5:
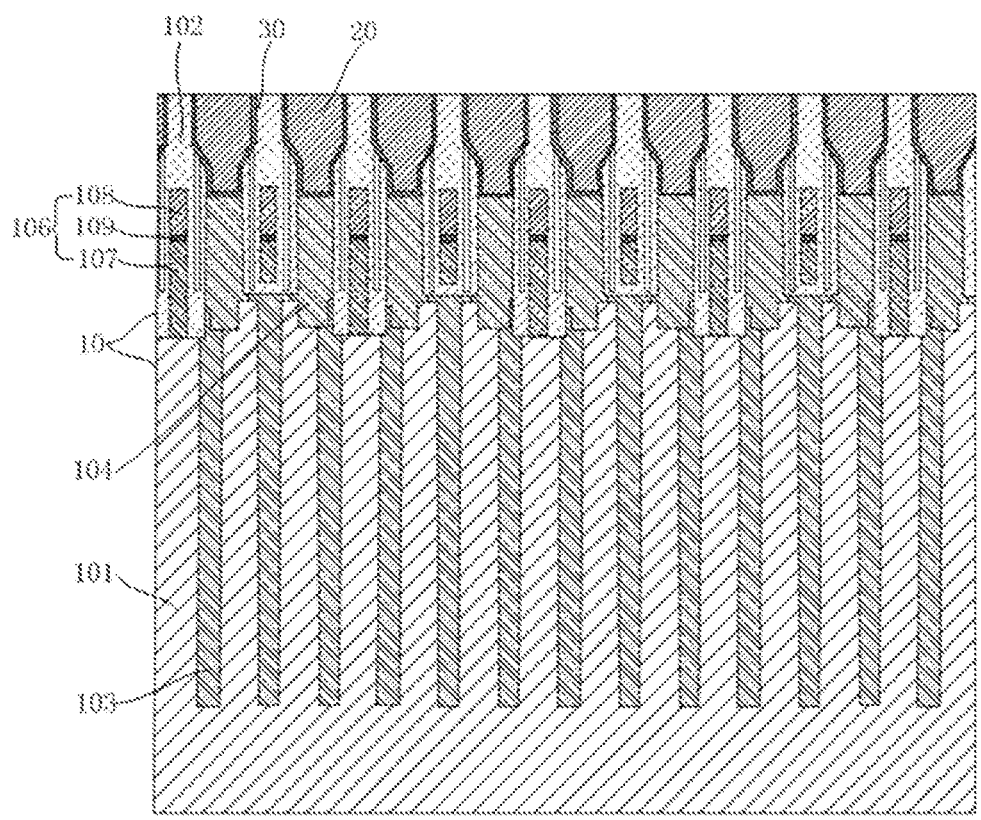
FIG. 5 is a schematic diagram of a structure after removing the first conductive layer outside the first hole structures in the semiconductor structure manufacturing method provided by an embodiment of the present application.
Figure 6:
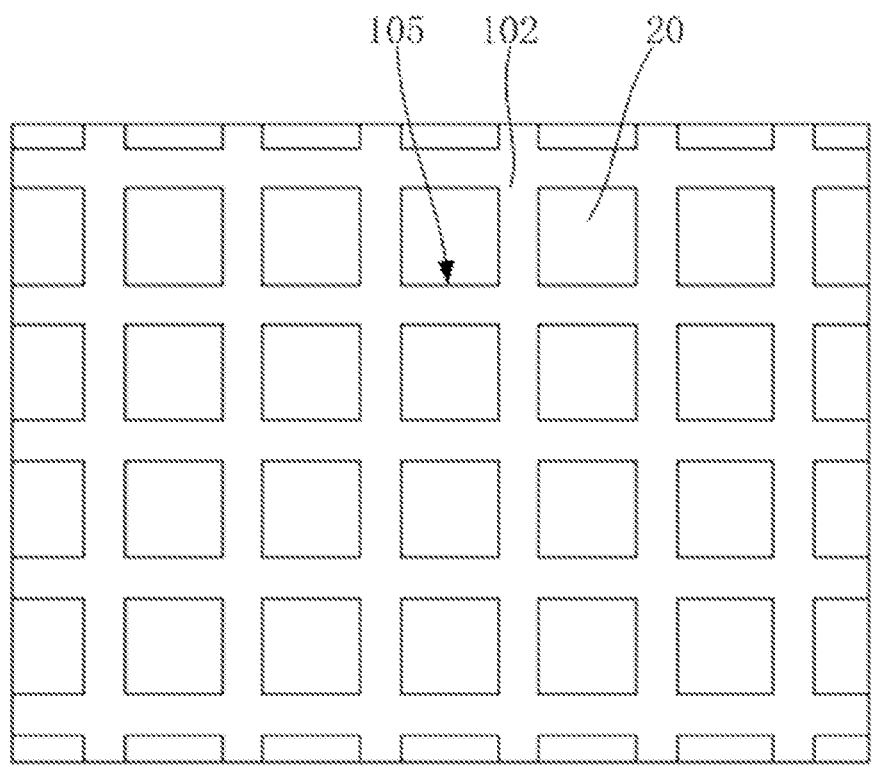
FIG. 6 is a top view of FIG. 5.
Figure 7:
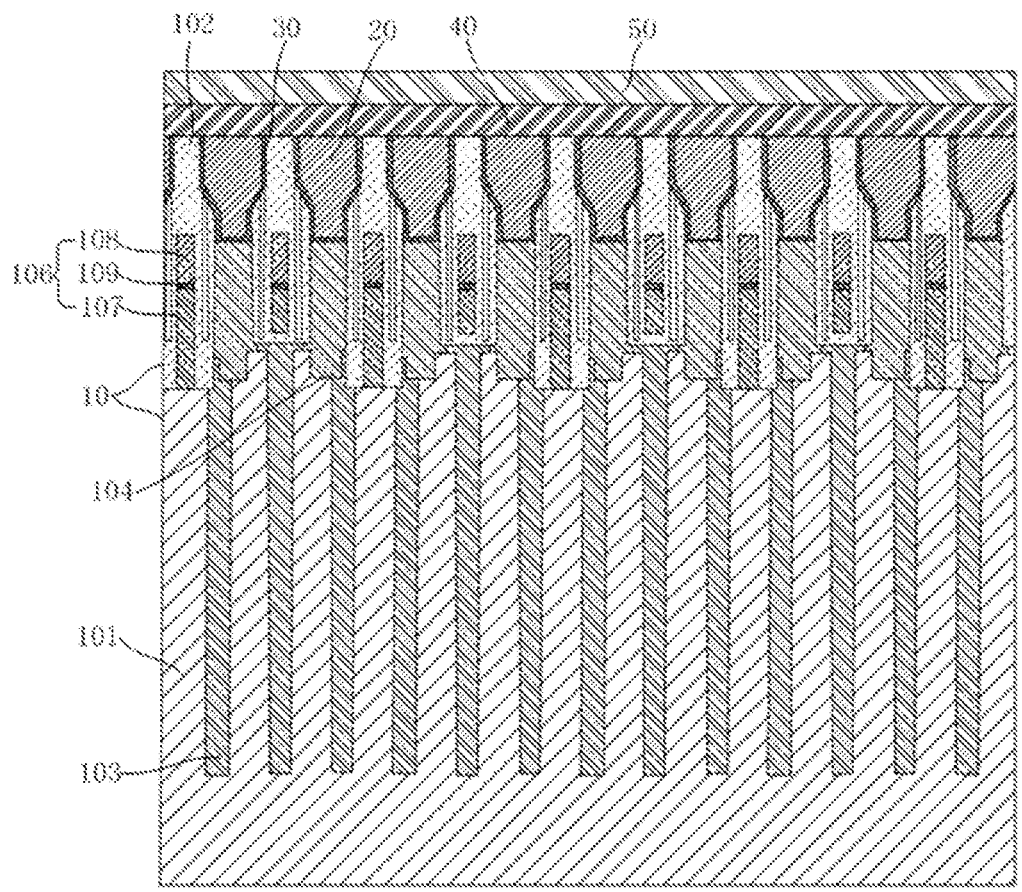
FIG. 7 is a schematic diagram of a structure after removing the first conductive layer outside the first hole structures in the semiconductor structure manufacturing method provided by an embodiment of the present application.

In this embodiment, the step in which the part of the barrier layer 30 and the part of the first conductive layer 20 are removed to form the first bonding pad structures 201 located in the first hole structures 105 includes:

Referring to FIGS. 4-6, the first conductive layer 20 and the barrier layers outside the first hole structures 105 are removed to make surfaces, away from the substrate 10, of the first conductive layer 20 and the barrier layer 30 flush with the substrate 10

When the first conductive layer 20 and the barrier layer 30 are formed, the first conductive layer 20 and the barrier layer 30 fill the first hole structures 105 and also cover the substrate 10. After the first conductive layer 20 and the barrier layer 30 outside the first hole structures 105 are removed, only the first conductive layer 20 and the barrier layer 30 located in the first hole structures 105 remain. The surfaces, away from the substrate 10, of the first conductive layer 20 and the barrier layer 30 are parallel to the surface of the substrate 10 to facilitate subsequent formation of film layers. Exemplarily, the first conductive layer 20 and the barrier layer 30 outside the first hole structures 105 may be removed by a process such as chemical-mechanical polishing (CMP).

Then, as shown in FIGS. 7-12, a first supporting layer 40, a mask layer 50 and a photoresist layer 60 with patterns are deposited on the first conductive layer 20, the barrier layer 30 and the substrate 10. Part of the first conductive layer 20 and part of the barrier layer 30 are removed with the photoresist layer 60 as a mask to form the first bonding pad structures 201.

Through the above arrangement, the part of the first conductive layer 20 and the part of the barrier layer 30 are removed with the photoresist layer 60 as the mask, so that etching precision is high, and performance of the semiconductor structure is improved.

Figure 8:
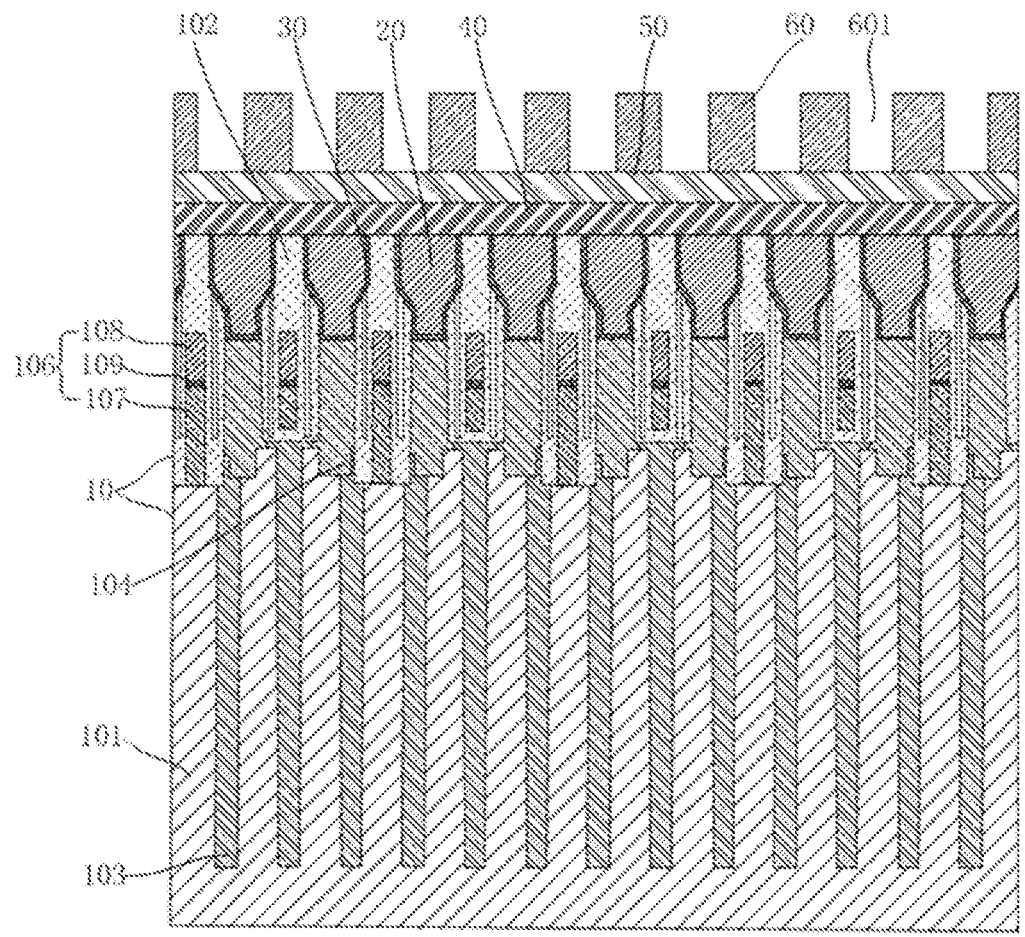
FIG. 8 is a schematic diagram of a structure after forming a patterned photolithography layer in the semiconductor structure manufacturing method provided by an embodiment of the present application.
Figure 9:
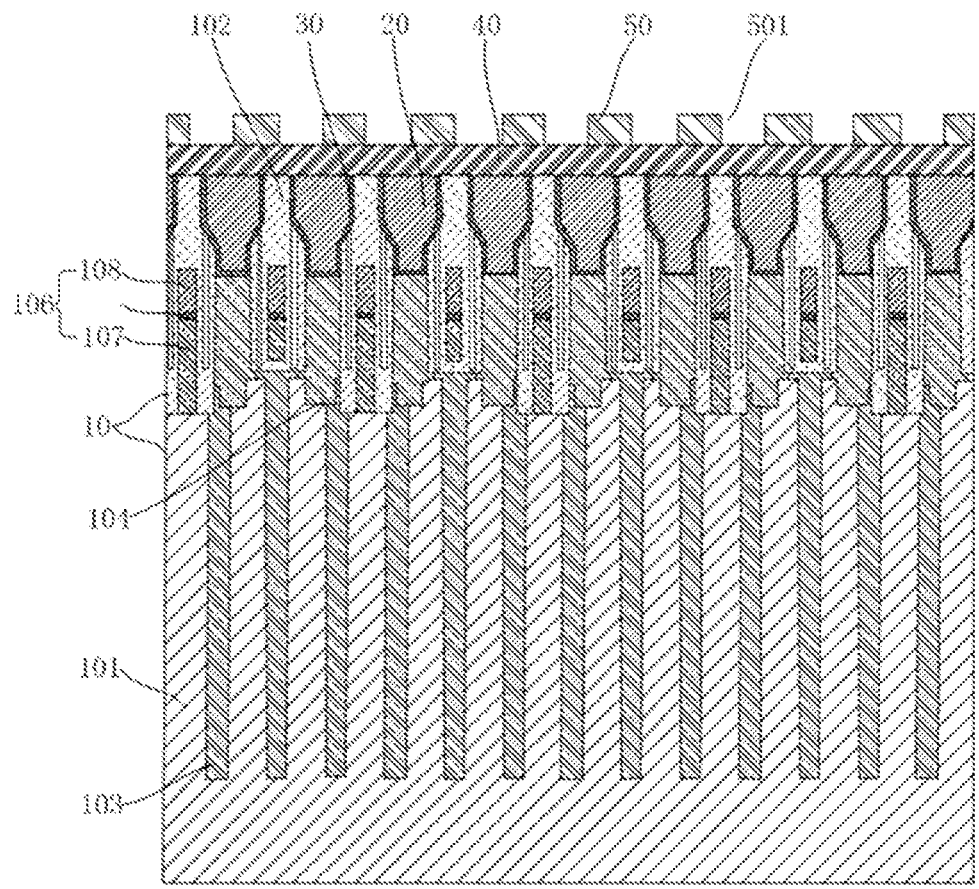
FIG. 9 is a schematic diagram of a structure after the mask layer is etched using the photolithography layer as a mask in the semiconductor structure manufacturing method provided by an embodiment of the present application.
Figure 10:
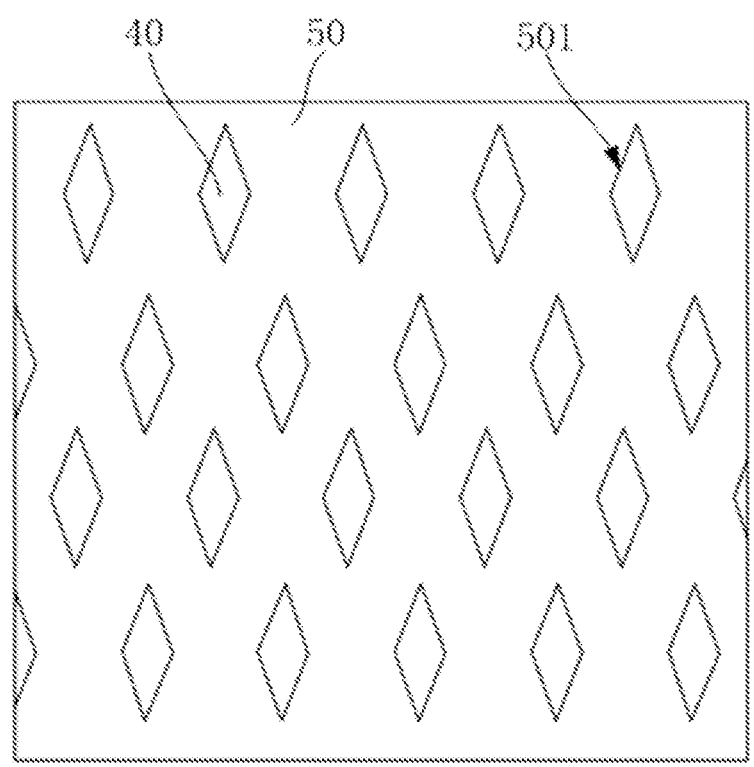
FIG. 10 is a top view of FIG. 9.

Further, the step in which the part of the first conductive layer 20 and the part of the barrier layer 30 are removed with the photoresist layer 60 as the mask to form the first bonding pad structures 201 includes: As shown in FIGS. 8-10, part of the mask layer 50 is etched with the photoresist layer 60 as a mask to form the mask layer 50 with patterns.

Exemplarily, the photoresist layer 60 has patterns, thereby being provided with a plurality of etching holes 601. A projection of each etching hole 601 on the first hole structures 105 covers the part of the first conductive layer 20 and the part of the barrier layer 30 in the first hole structures 105.

When the mask layer 50 is etched with the photoresist layer 60 as the mask, barrier holes 501 are formed in the mask layer 50 corresponding to the etching holes 601, so that the mask layer 50 with the patterns is formed.

Then, the photoresist layer 60 is removed. Part of the first supporting layer 40 is etched with the mask layer 50 with the patterns as a mask to form the first supporting layer 40 with patterns. Exemplarily, the first supporting layer 40 corresponding to the barrier holes 501 is removed to form the first supporting layer 40 with patterns.

As shown in FIG. 11 and FIG. 12, the mask layer 50 is removed, and the part of the first conductive layer 20 and the part of the barrier layer 30 are etched with the first supporting layer 40 with the patterns as a mask to form the first bonding pad structures 201. The first bonding pad structures 201 include the first conductive layer 20 remaining after etching and the barrier layer 30 remaining after etching. Because the projections of the etching holes 601 in the photoresist layer 60 on the first hole structures 105 cover the part of the first conductive layer 20 and the part of the barrier layer 30 in the first hole structures 105, when the first conductive layer 20 and the barrier layer 30 are etched with the first supporting layer 40 as the mask, only the part of the first conductive layer 20 and the part of the barrier layer 30 in the first hole structures 105 are removed, so that a port structure is formed on the first conductive layer 20 in the first hole.

Through the above arrangement, the part of the first conductive layer 20 and the part of the barrier layer 30 in the first hole structures 105 are removed through patterns transfer of the photoresist layer 60, the mask layer 50 and the first supporting layer 40. Etching precision is further improved.

In this embodiment, while the part of the first conductive layer 20 and the part of the barrier layer 30 in the first hole structures 105 are removed with the first supporting layer 40 as the mask, the first bonding pad structures 201 with pore structures are formed in the first hole structures 105. At the same time, second hole structures 401 are formed in the first supporting layer 40 and the first hole structures 105. In this way, subsequent formation of the semiconductor structure is facilitated.

Further, the step in which the second bonding pad structures 801 are formed on the first bonding pad structures 201, and the second bonding pad structures 801 are connected to the first bonding pad structures 201 includes:

As shown in FIGS. 13-18, second supporting layer 70 is formed in the second hole structures 401, and the second hole structures 401 are filled with the second supporting layer 70. The first supporting layer 40 is removed, and third hole structures 701 are formed in the second supporting layer 70. A second conductive layer 80 is deposited in the third hole structures 701, and the third hole structures 701 are filled with the second conductive layer 80 to form the second bonding pad structures 801. Because projections of the first supporting layer 40 on the first hole structures 105 cover part of the first bonding pad structures 201 in the first hole structures 105, the second bonding pad structures 801 formed in the third hole structures 701 are connected to the first bonding pad structures 201, so that connection the second bonding pad structures 801 and the first bonding pad structures 201 is achieved.

One second bonding pad structure is formed in each third hole structure 701. In this way, the second bonding pad structures 801 are formed in the third hole structures 701. The problem that the adjacent bonding pad structures 801 are bridged due to the limitation of the etching technology in the forming process of the second bonding pad structures 801 so as to form defects is avoided, and the yield of the semiconductor device is ensured.

Exemplarily, when the second conductive layer 80 is formed, the second conductive layer 80 further covers the second supporting layer 70 while filling the third hole structures 701. Correspondingly, after the second conductive layer 80 is formed, the second conductive layer 80 located outside the third hole structures 701 can be removed through a process such as CMP, so as to form the second bonding pad structures 801 formed in the third hole structures 701. The second bonding pad structures 801 only include remaining second conductive layer 80.

In the above implementation, an etching selectivity ratio of a material of the first supporting layer 40 to a material of the second supporting layer 70 is larger than 100. In this way, the etching selectivity ratio of the first supporting layer 40 to the second supporting layer 70 is large, when the first supporting layer 40 is removed in an etching manner, damage can be prevented from being caused to the second supporting layer 70, therefore, the precision of the second supporting layer 70 is improved, and the performance of the semiconductor device is improved. The material of the first supporting layer 40 may be silicon thin films and the like, and the material of the second supporting layer 70 may be silicon nitride and the like.

In this embodiment, a material of the first conductive layer 20 is the same as a material of the second conductive layer 80. In this way, resistance between the first bonding pad structures 201 and the second bonding pad structures 801 can be reduced, and therefore the performance of the semiconductor structure is improved. Exemplarily, both the material of the first conductive layer 20 and the material of the second conductive layer 80 may be tungsten.

Continuing to refer to FIGS. 2-17, this embodiment further provides a semiconductor structure which is manufactured by the semiconductor structure manufacturing method provided by any one of the above embodiments.

According to the semiconductor structure provided by this embodiment, a substrate 10 is provided with a plurality of active area structures 101 and a plurality of first hole structures 105 arranged at intervals. First bonding pad structures 201 are formed in the first hole structures 105, and the first bonding pad structures 201 are electrically connected to the active area structures 101. Second bonding pad structures 801 are formed on the first bonding pad structures 201. The second bonding pad structures 801 are connected to the first bonding pad structures 201, and connected to a capacitor structure. Compared with the method that a whole conductive layer is formed firstly and then the conductive layer is etched to form bonding pad structures, the method can avoid the problem that adjacent bonding pad structures are bridged due to the limitation of the etching technology in the forming process of the bonding pad structures so as to form defects, and ensures the yield of a semiconductor device.

Finally, it should be noted that: the above embodiments are merely illustrative of the technical solutions of the present application and are not intended to be limiting thereof. Although the present application has been described in detail with reference to the foregoing embodiments, those skilled in the art will appreciate that: the technical solutions of the above-mentioned embodiments can still be modified, or some or all of the technical features thereof can be equivalently replaced; and these modifications and substitutions do not make the nature of the corresponding technical solutions depart from the scope of the technical solutions of the embodiments of the present application.

The invention claimed is:

1. A semiconductor structure manufacturing method, comprising:

providing a substrate, wherein the substrate comprises a plurality of active area structures, a plurality of bit line structures on the plurality of active area structures, an insulating layer on the plurality of bit line structures, and a plurality of first hole structures distributed at intervals and penetrating through the insulating layer;

forming a barrier layer on side walls and bottom walls of the plurality of first hole structures and a top surface of the insulating layer;

forming a first conductive layer on the barrier layer, wherein the plurality of first hole structures are filled with the barrier layer and the first conductive layer;

removing the first conductive layer and the barrier layer outside the plurality of first hole structures to make top surfaces of the first conductive layer and the barrier layer flush with the top surface of the insulating layer;

forming a first supporting layer with patterns on the first conductive layer, the barrier layer and the insulating layer, wherein the first supporting layer with patterns exposes part of the top surface of the insulating layer, part of the first conductive layer and part of the barrier layer;

etching the part of the first conductive layer and the part of the barrier layer with the first supporting layer with patterns as a mask, to form a plurality of first pad structures in the plurality of first hole structures, and a plurality of second hole structures in the first supporting layer and the first hole structures, wherein the plurality of first pad structures are electrically connected to the plurality of active area structures, respectively;

depositing a second supporting layer in the plurality of second hole structures, wherein the plurality of second hole structures are filled with the second supporting layer, and the second supporting layer covers the part of the top surface of the insulating layer;

removing the first supporting layer with patterns, and forming a plurality of third hole structures in the second supporting layer; and forming a plurality of second pad structures in the plurality of third hole structures, wherein the plurality of second pad structures are connected to the plurality of first pad structures, respectively.

2. The semiconductor structure manufacturing method of claim 1, wherein an etching selectivity ratio of a material of the first supporting layer to a material of the second supporting layer is larger than 100.

3. The semiconductor structure manufacturing method of claim 1, wherein a material of the plurality of first pad structures is the same as a material of the plurality of second pad structures.

4. The semiconductor structure manufacturing method of claim 3, wherein both the material of plurality of first pad structures and the material of the plurality of second pad structures are tungsten.

5. The semiconductor structure manufacturing method of claim 1, wherein the removing the first conductive layer and the barrier layer outside the plurality of first hole structures to make top surfaces of the first conductive layer and the barrier layer flush with the top surface of the insulating layer comprises:

removing the first conductive layer and the barrier layer outside the plurality of first hole structures by a process of chemical-mechanical polishing.

6. The semiconductor structure manufacturing method of claim 1, wherein a material of the barrier layer comprises titanium nitride.

7. The semiconductor structure manufacturing method of claim 1, wherein the substrate further comprises capacitor contact structures, the first pad structures are connected to the capacitor contact structures, and the capacitor contact structures are connected to the active area structures.

8. The semiconductor structure manufacturing method of claim 1, after the forming a plurality of second bonding pad structures, further comprising:

forming capacitor structures, wherein the capacitor structures are connected to the second pad structures.

9. A semiconductor structure, manufactured by the semiconductor structure manufacturing method of claim 1.

* * * * *